United States Patent [19]

Upadhyayula

[11] Patent Number: 4,647,789
[45] Date of Patent: Mar. 3, 1987

[54] ACTIVE ELEMENT MICROWAVE PHASE SHIFTER

[75] Inventor: Lakshminarasimha C. Upadhyayula, East Windsor Township, Mercer County, N.J.

[73] Assignee: RCA Corporation, Princeton, N.J.

[21] Appl. No.: 650,655

[22] Filed: Sep. 14, 1984

[51] Int. Cl.$^4$ .......................... H03H 7/21; H03K 5/00
[52] U.S. Cl. .................................... 307/262; 307/511; 307/512; 307/299 R; 328/155; 333/104
[58] Field of Search ........... 307/511, 513, 262, 299 R, 307/304, 571, 501, 512; 328/155; 333/104, 127

[56] References Cited

U.S. PATENT DOCUMENTS

| | | | |
|---|---|---|---|
| 3,634,702 | 1/1972 | Drangeld | 307/299 |
| 4,153,994 | 5/1979 | Ren | 333/157 |
| 4,232,399 | 11/1980 | Heiter | 455/276 |
| 4,450,372 | 5/1984 | Diamand | 307/511 |
| 4,511,813 | 4/1985 | Pan | 307/501 |

OTHER PUBLICATIONS

"Dual Gate GaAs MESFET Phase Shifter with Gain at 12 Mhz", Electronics Letters, Jul. 3, 1980, vol. 16, No. 14, pp. 553-554, by C. Tsifonis et al.
"Dual Gate FET Phase Shifter", RCA Review, vol. 42, No. 4, 10 Dec. 1981, pp. 596-616, by Mahesh Kumar.
"Performance of Dual-Gate GaAs MESFET's as Gained-Controlled Low-Noise Amplifiers and High--Speed Modulators", by C. A. Liechti, *IEEE Transactions on Microwave Theory and Techniques*, vol. MTT-23, No. 6, Jun. 1975, pp. 461-469.

Primary Examiner—Stanley D. Miller
Assistant Examiner—Richard Roseen
Attorney, Agent, or Firm—Joseph S. Tripoli; Robert L. Troike; Robert Ochis

[57] ABSTRACT

A continuously variable phase shifter for the phase range from 0° to 90°, switchable phase shifters switchable between 0° and 90° and a continuously variable phase shifter for the phase shift range of 0° to 360° are disclosed. Each of the phase shifters relies on dual gate FET devices to provide the required phase shift in a compact structure while providing sufficient gain to avoid signal losses through the phase shifter. The transmission phase shift through a dual gate FET device is controlled by the DC bias on its second gate and by the type of reactive termination on that gate. A capacitive termination provides a transmission phase shift which is substantially independent of bias while an inductive termination provides a transmission phase shift which varies substantially linearly with bias voltage over a substantial range of bias voltage.

8 Claims, 5 Drawing Figures

ACTIVE ELEMENT MICROWAVE PHASE SHIFTER

The Government has rights in this invention pursuant to Contract No. N00014-79-C-0568 awarded by the Department of the Navy.

RELATED APPLICATION

This patent is related to my patent application entitled, "ACTIVE ELEMENT MICROWAVE POWER COUPLER", Ser. No. 650,645, co-filed herewith on Sept. 14, 1984, assigned to the present assignee, and incorporated herein by reference.

BACKGROUND OF THE INVENTION

The present invention relates to microwave circuits and more particularly to microwave phase shifters The use of microwave systems has been increasing as more microwave components have become available. In many microwave circuits lightweight and small size are important. As a result, such circuits are often fabricated in strip transmission line form. A strip transmission line is one in which microwave signals are carried by narrow strip conductors spaced by a dielectric region from at least one substantially wider ground conductor. A microstrip circuit is a special case of a strip transmission line circuit in which the strip conductors are disposed on one major surface of a solid dielectric substrate and the wider ground conductor is disposed on the other major surface of that substrate.

One microwave circuit which is often used as a building block in the fabrication of more complicated microwave circuits is the microwave phase shifter. One of the most common types of microwave phase shifters is the switched line phase shifter in which the phase shift is changed by switching strip conductors having different line lengths into and out of the signal path. The switching is done by diodes or other active devices. Such phase shifters suffer from several disadvantages. They require substantial substrate area for their fabrication because of the need to provide a number of separate switchable lines some of which may be as long as a quarter wavelength or a half wavelength. They are lossy devices and attenuate the signal being phase shifted. They are also relatively narrow bandwidth devices because each switched line provides an exact fraction of a wavelength at only one frequency. That frequency is usually referred to as the center frequency. The actual phase angle changes with frequency. The greater the difference between the center frequency and the operating frequency, the more the actual phase shift differs from the desired phase shift. This restricts such phase shifters to relatively narrow bandwidths of about $\pm 10\%$ =about their center frequency.

There is a need for a lightweight, compact and relatively broadband phase shifter which introduces less loss or provides some gain to the signals transmitted therethrough.

SUMMARY OF THE INVENTION

The present invention achieves the goals of compactness, gain and wideband operation by providing integrated circuit microwave transmission phase shifters whose phase shift is achieved by active devices. A continuously variable transmission phase shifter comprises a non-equal-phase power splitter coupled to a controllable power combiner. Each leg of the power splitter contains at least one dual gate FET device. The power splitter provides a pair of equal amplitude output signals having a phase difference of $\phi°$. The controllable power combiner comprises a pair of dual gate FET devices having their drains connected in common. These FET devices recombine the two non-equal-phase signals with controllable amplitudes to produce an output signal having a selectable, continuously variable, phase shift within the range from 0° to $\phi°$. Switchable phase shifters are provided which employ parallel connected dual gate FET devices one of which provides a reference transmission phase shift and the other of which provides a transmission phase shift of $\phi°$ relative to the reference phase. One of these parallel FET devices is biased ON while the other is biased to OFF in accordance with whether a phase shift of 0° or $\phi°$ is desired. Phase shifts in the range 0° to 360° can be provided by a continuously variable phase shifter connected in series with a series of the switchable phase shifters. The relative insertion phase of the series of switchable phase shifters is switchable over a range from 0° to $(360° - \phi°)$, in increments of $\phi°$.

DETAILED DESCRIPTION OF THE PREFERRED EMBODIMENT

Figure 1:
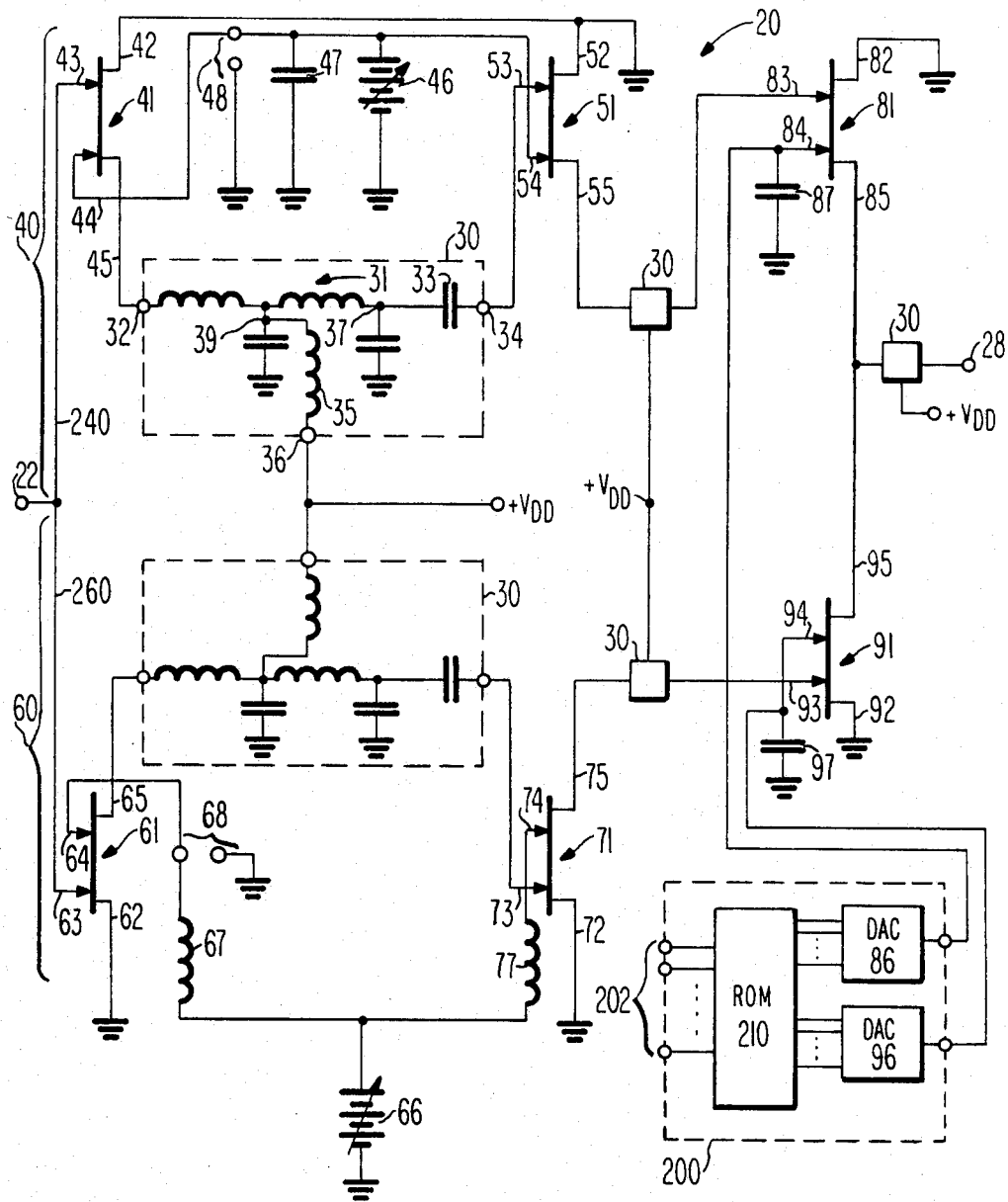
FIG. 1 is a schematic circuit diagram of a continuously variable phase shifter according to one embodiment of the present invention.

Referring to the schematic circuit diagram of FIG. 1 the microwave phase shifter 20 provides any desired phase shift between 0° and $\phi°$, where $\phi°$ is selectable over a range from 0° to about 60° without attenuating the signal. This phase shifter is preferably fabricated as an integrated circuit and has an input terminal 22 and an output terminal 28 which are connected by a first coupling path or leg 40 in the upper portion of FIG. 1 and a second coupling path or leg 60 in the lower portion of FIG. 2. The upper path 40 comprises three dual gate FET devices 41, 51 and 81 connected in cascade and the lower path 60 comprises three dual gate FET devices 61, 71 and 91 connected in cascade. All of the FET devices in these circuits are microwave devices and may preferably be GaAs N-channel depletion mode MESFETs. A MESFET is a metal semiconductor field effect transistor.

The sources 42, 52 and 82 of the FET devices 41, 51 and 81, respectively are connected to ground. FET device 41 has its first gate 43 connected via a lead 240 to the input terminal 22 and its second gate 44 coupled to a source 46 of DC (direct current) bias voltage and to a capacitor 47 coupled at the other end to ground. The drain 45 of transistor 41 is connected to the first gate 53 of transistor 51 via a three terminal coupling network 30 which provides the drain with a positive voltage from supply $V_{DD}$ while decoupling that DC bias from the output signal provided to gate 53. Network 30 includes a matching network 31 connected between terminal 32 and an internal node 37, a DC blocking capacitor 33 connected between node 37 and terminal 34 and an RF (radio frequency) choke 35 connected between a node 39 and terminal 36. Capacitor 33 prevents the drain bias voltage from being applied to first gate 53 of FET device 51. Choke 35 prevents the RF signal from reaching the $V_{DD}$ bias supply and its buses. Matching network 31 is in the form of an LC bandpass filter which provides impedance transformation to match the drain impedance of FET device 41 to the first gate impedance of FET device 51. The detailed structure of the bandpass filter 31 depends on the bandwidth over which it is desired to operate the power splitter and the impedances between which the filter is to provide transformation.

FET device 51 has its second gate 54 coupled to the same source 46 of bias potential and the same terminating capacitor 47 as the gate 44. The drain 55 of transistor 51 is coupled to the first gate 83 of transistor 81 and to the $V_{DD}$ source through another coupling network 30. FET device 81 has its second gate 84 coupled to the analog output of a digital to analog (D to A) converter (DAC) 86 and a terminating capacitor 87. FET device 81 has its drain 85 connected directly to the drain 95 of FET 91 in the lower leg 60 and coupled to the output terminal 28 and the $V_{DD}$ bias supply via another coupling network 30.

The respective sources 62, 72 and 92 of the FET devices 61, 71 and 91 in the lower path 60 are each connected to ground. FET device 61 has its first gate 63 connected via a lead 260 to the input terminal 22 and its second gate 64 coupled to a DC bias supply 66 and a terminating inductance 67. The term "terminating" is used herein in the sense of treating the second gate and ground as a port of the dual gate FET circuit. That port is terminated by the terminating impedance. The drain 65 of FET device 61 is coupled to the first gate 73 of transistor 71 and the $V_{DD}$ bias supply coupling network 30.

FET device 71 has its second gate 74 coupled to the same DC bias supply 66 as gate 64 via a terminating inductance 77. Separate terminating inductors are used in lower leg 60 to prevent coupling between second gates 64 and 74. A single terminating capacitor can be used in upper leg 40 because that capacitor's impedance is low enough that it does not cause coupling between gates 44 and 54. However, separate capacitors may be used. The drain 75 of transistor 71 is coupled to the first gate 93 of transistor 91 and the $V_{DD}$ bias supply via another coupling network 30. FET device 91 has its second gate 94 coupled to the analog output of a D to A converter 96 and a terminating capacitor 97. FET device 91 has its drain 95 connected directly to the drain 85 of FET device 81 and coupled to the output terminal 28 and the $V_{DD}$ bias supply via the same coupling network 30 which couples the drain 85 to terminal 28.

The sum of two quadrature RF signals (A and B) has an amplitude which is the square root of the sum of the squares of the magnitudes of the two quadrature signals and has a phase angle which is the inverse tangent of the magnitude of the B signal divided by the magnitude of the A signal, where the B signal leads the A signal by 90°. The FET devices 81 and 91 are used to recombine the signals at the gates 83 and 93 to form the output signal in accordance with this formula. The signal at gate 83 is the B signal and the signal at the gate 93 is the A signal. By proper specification of the analog voltages supplied by D to A converters 86 and 96 the amplitude of the output signal may be held constant as its phase is varied from 0° to 90°. A control system 200 is provided for setting these D to A converters to provide the desired phase shift.

The control system 200 receives a phase setting signal on a set of phase setting input terminals 202. The desired phase shift is preferably specified in binary form. The input signal received on terminals 202 is decoded in control system 200 into the digital values which cause D to A converters 86 and 96 to produce the analog voltages which will induce the specified phase shift. This decoding is done in system 200 by providing the input signal as the address signal of a read only memory (ROM) 210. The output of the ROM 210 in response to a given input signal has two separate portions. A first portion is the digital value to set digital-to-analog converter 86 to provide the dc voltage needed at the second gate 84 of FET device 81. The second portion of the ROM output is the digital value to set D to A converter 96 to provide the DC voltage needed at the second gate 94 of FET device 91.

An LC matching network may be included between input terminal 22 and the first gates 43 and 63 if it is desired to improve the match between phase shifter 20 and the source of its input signal.

Figure 4:
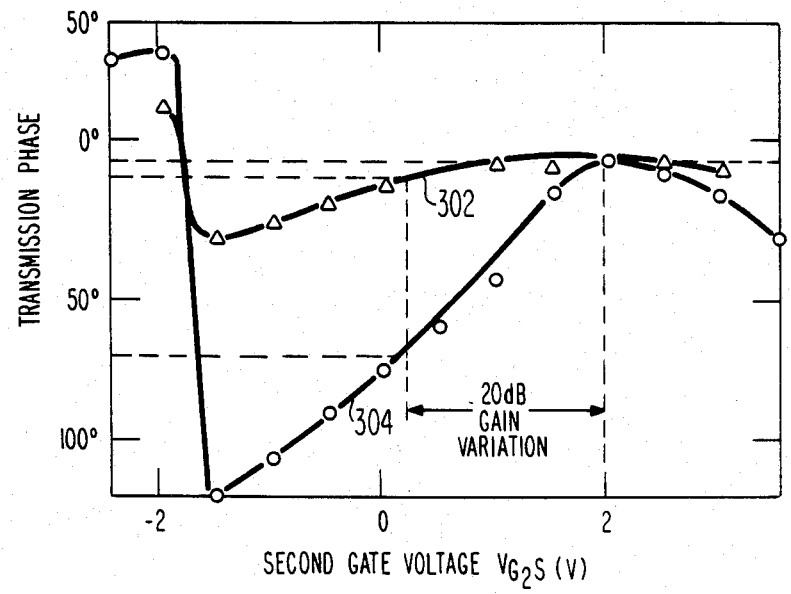
FIGS. 4 and 5 illustrate transmission phase shift and transmission gain characteristics for dual gate FET devices which are helpful in explaining the operation of the present invention.

The lower leg's second gate bias supply 66 is set to a voltage which causes the signal transmitted through the lower path 60 to reach the gate electrode 93 of transistor 91 with a transmission phase shift which is 90° greater than that with which the signal propagated through the upper path 40 reaches the gate 83. Referring now to FIG. 4, the phase shift characteristics of a single dual gate FET device with its second gate terminated capacitively and inductively are illustrated as a function of bias voltage by the curves 302 and 304, respectively. From curve 302 it is seen that for a dual gate FET device with its second gate capacitively terminated, the transmission phase shift is substantially constant independent of the bias voltage. For this reason the transmission phase shift of a capacitively terminated FET device at a given bias voltage (+2.0 volt relative to the source DC voltage) is taken as a reference phase and assigned a relative transmission phase of 0°. From curve 304, it is seen that the transmission phase shift for an inductively terminated FET device varies nearly linearly with bias voltage over a substantial range. This transmission phase shift reaches the reference value at a second gate bias of about +2.0 volts relative to the source of the FET device. For a bias of about +0.8 volt, the phase shift of the inductively terminated FET device is 45° relative to the reference value. Thus, the voltage value provided by the bias source 66 can be selected to establish a phase difference of 90° (2×45°) between the signal at the gate electrode 83 and the signal at the gate electrode 93.

Figure 5:
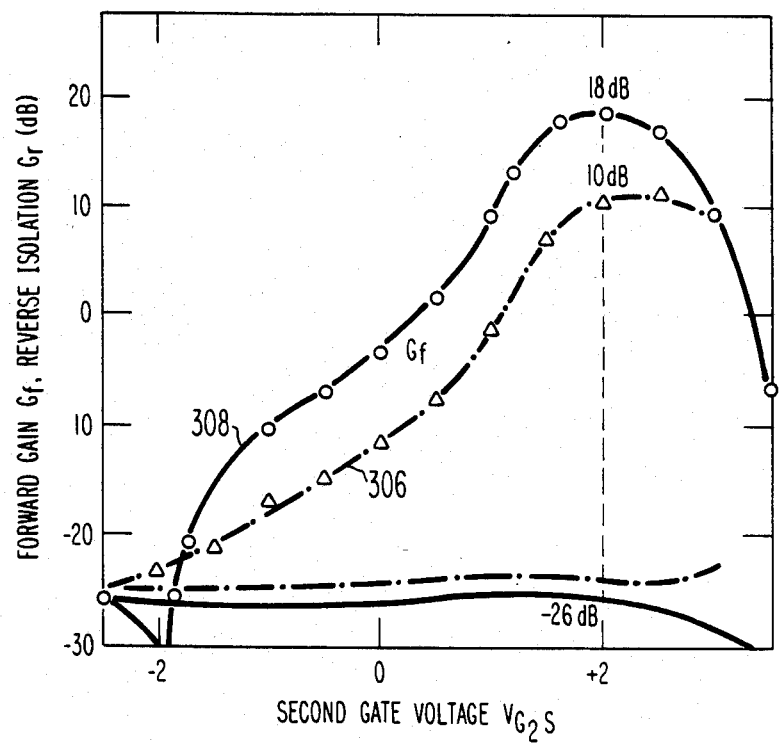

Referring now to FIG. 5 it is seen from curve 308 that a bias voltage of +0.8 volts for an inductively terminated second gate yields a gain of substantially 3 dB. In order that the signals at gates 83 and 93 will have the same amplitude, the bias voltage from the upper leg second gate bias source 46 is selected in accordance with curve 306 of FIG. 5 to cause the devices 41 and 51 to produce the same gain as is produced by the devices 61 and 71. This is a bias voltage of substantially 1.5 volts.

Splitting the input signal at terminal 22 into two separate paths causes a 3 dB power reduction in each path relative to the input signal (ignoring losses). The gains of transistors 41 and 61 compensate for this power loss in each leg. FET devices 51 and 71 then compensate for any other losses with some gain left over. The result is that the signal emerging from each leg has a power level which is substantially the same as or greater that that of the incoming signal.

The curves of FIGS. 4 and 5 are taken from an article entitled, "Performance Of Dual-Gate GaAs MESFET's as Gain-Controlled Low-Noise Amplifiers and High-Speed Modulators" by Charles A. Liechti which appeared in IEEE Transactions on Microwave Theory and Techniques, Vol. MTT-23, No. 6, June 1975 pp. 461-469. That article is incorporated herein by reference.

These characteristics of the dual gate FET devices are used to control the relative phase and gain of the output signals. Capacitively terminating the second gates in one leg and inductively terminating the second gates in the other leg provides the ability to select a relative phase difference of 90° between the output signals by selection of the bias voltage on the second gates which are inductively terminated. The optimum capacitance for such a termination depends on the characteristics of the FET and the intended operating frequency of the phase shifter and is generally in the 20 pf to 30 pf range at 10 GHz. The optimum value of the terminating inductance depends on the characteristics of the FET and the operating frequency and is generally in the 1 nh to 2 nh range at 10 GHz. Equal gains in both legs can be obtained in either case because of the similar gain vs. bias behavior of these FET devices for both capacitive and inductive termination of their second gates and because the phase shift of an FET device having a capacitively terminated second gate is almost independent of bias.

Optimum values for the terminating capacitance or inductance can be experimentally determined by biasing the second gate of an FET device 41, for example, at the voltage which provides maximum gain and then varying the terminating reactance to provide a reflection coefficient of unity amplitude and a phase angle of substantially −45° for a capacitive termination and substantially 153° for an inductive termination. This reflection coefficient is measured at the terminal set 48 (or 68 for inductor termination). The transmission phase and gain of the FET is less sensitive to changes in the value of a terminating capacitor than it is to changes in the value of a terminating inductor. This is in keeping with the relative insensitivity of transmission phase shift to second gate bias voltage when the second gate is capacitively terminated (curve 306) and the linear variation of transmission phase shift with second gate bias voltage when the second gate is inductively terminated (curve 308).

Adjusting the bias on gate 84 can vary the gain of FET device 81 over a range from 10 dB to −20 dB. The same gain adjustment range is available for FET device 91. When a particular phase shift is desired, the requisite power levels for the upper leg signal and the lower leg signal can be determined in accordance with the above relationships. A pair of bias voltages are to be provided by D to A converters 86 and 96 in order to produce that phase shift with the desired amplitude. The digital values which cause D to A converters 86 and 96 to produce these voltages are stored in ROM 210.

It will be recognized, that by choosing the bias voltage supplied by source 66 to produce a different phase shift through leg 60, the phase range over which the output signal 28 may be varied can be increased or decreased. However, the basic concept of the operation of the phase shifter 20 would still be the same.

In operation, the DC voltages applied between the source and the drain and between the source and the second gate 44 of transistor 41 bias FET device 41 at a point on its operating curve where it provides gain.

The RF signal connected to first gate 43 modulates the source-drain current of FET device 41. The effect of the capacitance 47 is discussed previously. The coupling of the first gate 53 of FET device 51 to the drain 45 of FET device 41 causes the output signal from transistor 41 to modulate the source-drain current of FET device 51. The gain of FET devices 41 and 51 causes the output power available at drain 55 to be greater than one half of the power provided at input terminal 22 of phase shifter 20. The operation of the lower coupling path 60 is similar to that of upper path 40 except for the effect of inductances 67 and 77.

This phase shifter has a number of advantages over the prior art passive device techniques. First, since it is entirely comprised of active devices fabricated in an integrated form, it is much more compact than switched line type phase shifters. Second, since each of the transistors can be operated in a manner to provide both gain and a desired relative phase shift, no separate amplifying stage is needed. This contrasts with the prior art where separate amplifying stages may be needed in order to maintain transmitted signals at desired power levels.

Figure 2:
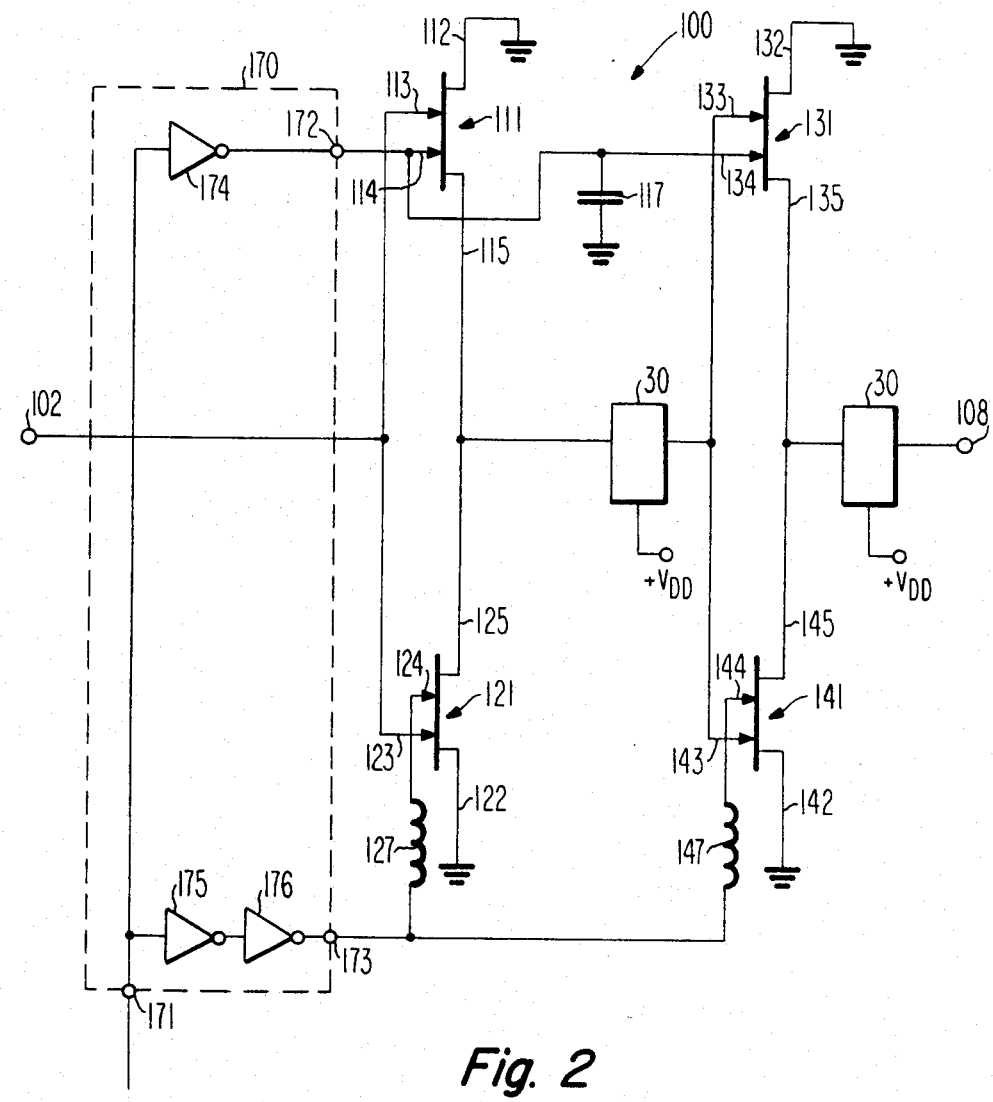
FIG. 2 is a schematic circuit diagram of a switchable phase shifter whose relative transmission phase shift may be switched between 0° and $\phi°$.

FIG. 2 illustrates in schematic circuit diagram form, an integrated circuit microwave switchable phase shifter 100 which can provide a phase shift of either 0° or 90°. The phase shifter 100 has an input terminal 102 and an output terminal 108. Phase shifter 100 is comprised of four dual gate FET devices 111, 121, 131, and 141. The sources 112, 122, 132 and 142 of these FET devices are each connected to ground. The first gates 113 and 123 of FET devices 111 and 121 are connected to the input terminal 102. The second gate 114 of FET device 111 is capacitively terminated by a capacitor 117 and is connected to a first output terminal 172 of a second gate bias driver 170. The second gate 124 of FET device 121 is inductively terminated by an inductor 127 which connects it to the other output terminal 173 of second gate bias driver 170. The drains 115 and 125 of FET devices 111 and 121, respectively, are connected together and coupled via a bias coupling network 30 to the first gates 133 and 143 of the FET devices 131 and 141. The second gate 134 of FET device 131 is connected to the second gate 114 of FET device 111 and is thus capacitively terminated and coupled to bias driver terminal 172. The second gate 144 of FET device 141 is inductively terminated by an inductor 147 which connects it to terminal 173. The drains 135 and 145 of these two devices are connected together and coupled via another coupling network 30 to the output terminal 108.

Second gate bias driver 170 has an input terminal 171 in addition to its two output terminals. Input terminal 171 is coupled via a single, level-shifting inverter 174 to output terminal 172. Input terminal 171 is coupled via a series connection of two inverters 175 and 176 to output terminal 173. Inverter 176 is a level-shifting inverter. When a logical zero (zero-volts DC) is applied to input terminal 171, the output voltage at terminal 172 is +1.5 volts and the output voltage at terminal 173 is −2.5 volts. When a logical one (a positive voltage such as 1 volt) is applied to input terminal 171, the output voltage at terminal 172 is −2.5 volts and the output voltage at terminal 173 is +0.8 volts. A logical zero causes FET device 121 to be biased OFF and FET device 111 to be biased ON to provide a reference transmission phase shift (0° relative phase) from input terminal 102 to the common connection of the drains 115 and 125. A logical one causes FET device 111 to be biased OFF and FET device 121 to be biased ON to produce a relative transmission phase shift of 45° from input terminal 102 to the common connection of drains 115 and 125. The same conditions are repeated in devices 131 and 141 whereby a logical zero produces a 0° relative transmission phase shift at output terminal 108 and a logical one produces a 90° relative transmission phase shift at output terminal 108. The bias values of +1.5 volts and +0.8 volts are selected to provide a constant gain from terminal 102 to terminal 108 independent of the phase shift selected. The second gate bias driver enables rapid switching of the phase shifter 100.

Although the FET devices 111 and 121 are shown as two separate FET transistors with their drain electrodes connected together, they may also be provided in the form of a pair of dual gate FET devices having a single merged drain. The drains of the FET devices 131 and 141 may also be merged if desired.

As has been explained, the phase shifter 20 of FIG. 1 is continuously variable and will provide any desired phase shift from 0° to 90° and the phase shifter 100 is switchable and will provide a phase shift of either 0° or 90°. Normally it is desired to be able to select any phase shift between 0° and 360° in a continuously variable manner.

Figure 3:
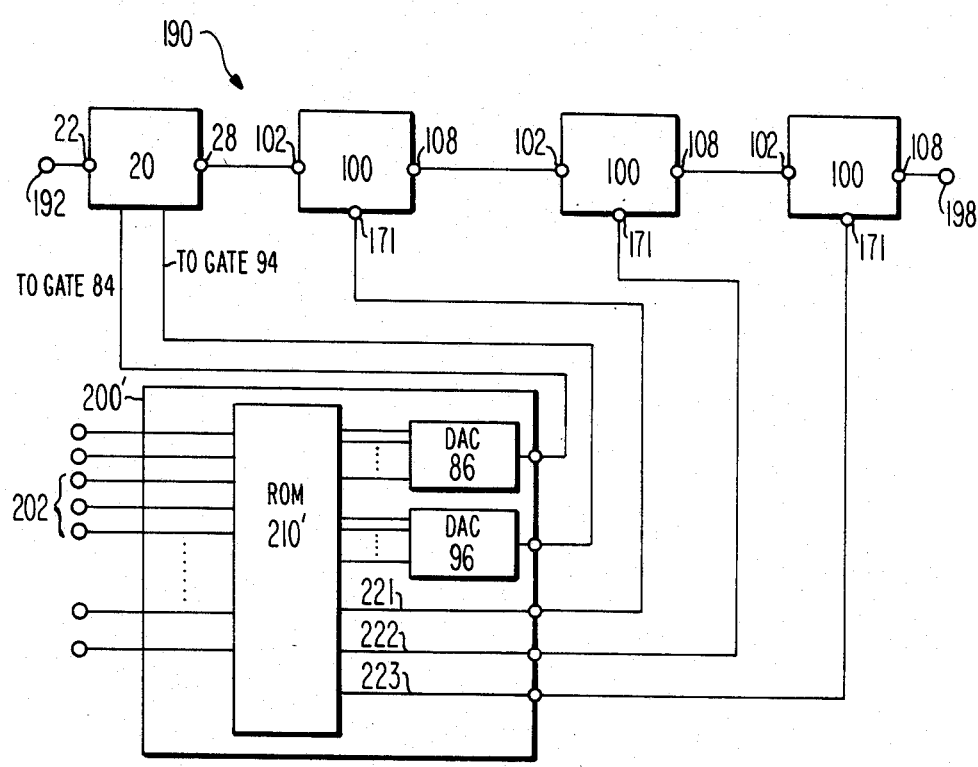
FIG. 3 is a block diagram of a phase shifter in accordance with the present invention which is capable of providing any desired phase shift between 0° and 360°.

FIG. 3 is a block diagram of a phase shifter 190 which combines phase shifters 20 and 100 to provide any desired phase shift between 0° and 360° in a continuously variable manner. The phase shifter 190 comprises a 0° to 90° continuously variable phase shifter 20 connected in series with three switchable 0° or 90° phase shifters 100. The series of these four phase shifters is connected between an input temrinal 192 and an output terminal 198. Any desired phase shift between 0° and 360° can be established by properly setting the bias voltages in the various phase shifters 20 and 100. In order to set these bias voltages automatically, a modified version 200' of control system 200 is provided. ROM 210' of control system 200' has a combination address. A first portion is identical to that of ROM 210 and specifies the phase shift to be provided by phase shifter 20. The second portion specifies the phase shift to be provided by the three phase shifters 100. In addition to providing the same outputs as ROM 210, ROM 210' provides three other outputs (221, 222, 223) which assume either a logical zero or a logical one state in accordance with the desired setting of the three phase shifters 100. A different one of these outputs is connected to the input terminal 171 of the second gate bias driver 170 of each phase shifter 100. Where it is desired that the corresponding phase shifter 100 be set to a relaitve phase shift of 0°, the value provided by the ROM is a logical zero (zero volts) which causes the upper transistors 111 and 131 to be biased ON and the lower transistors 121 and 141 to be biased OFF. Where it is desired that the associated phase shifter 100 provide a 90° phase shift, that output from ROM 210 is a digital one (a positive voltage) which causes the upper transistors 111 and 131 of the phase shifter 100 to be biased OFF and the lower transistors 121 and 141 to be biased ON to contribute a relative transmission phase shift of 90° from that phase shifter's input terminal 102 to its output terminal 108. The bias voltages are selected to provide a transmission phase shift which is 90° greater in response to a logical one than the transmission phase shift which is provided in response to a logical zero.

In this way, switching the state of one phase shifter 100, changes the insertion phase of the phase shifter 190 by 90°. In this manner, any desired phase shift between 0° and 360° may be provided by the phase shifter 190.

It would also be possible to provide this 0°–360° phase shift by substituting from one to three phase shifters 20 for from one to three of the phase shifters 100 in FIG. 3. It would also be possible to substitute for continuously variable phase shifter 20 a single stage continuously variable phase shifter designed to operate over the shift range of 0° to 45° in combination with a switchable phase shifter switchable between 0° and 45° phase shift. However, either of these substitutions would require more control circuitry in order to set the desired phase. For this reason, the phase shifter 190 illustrated in FIG. 3 is preferred over such substituted phase shifters.

The phase shifters 20 and 100 of phase shifter 190 are fabricated as a gallium arsenide (GaAs) integrated circuit on a GaAs chip. The coupling networks 30 and the terminating reactances are preferably fabricated directly on the GaAs chip. However, external components may be used where larger values are needed than can be conveniently fabricated on the chip. The D to A converters may be integrated on the same chip or may be external.

In a microwave circuit, the integrated phase shifter 190 is preferably physically disposed between the two portions of the stripline, microstrip or other circuit it connects. Jumper conductors connect the terminals 192 and 198 to the appropriate RF conductors on the coupled circuits.

Phase shifters in accordance with this invention are relatively wideband devices because they rely on active devices to create their phase shifts. These phase shifters are usable over an octave frequency range. The use of active devices to create the phase shifts (rather than just to switch lines as in the prior art) also enables phase shifters in accordance with the invention to be fabricated in vary compact monolithic forms, although non-monolithic forms may also be used.

What is claimed is:

1. An RF phase shifter for imparting to a signal transmitted from its input terminal to its output terminal a selectable relative phase shift which is continuously variable in a range from 0° to $\phi$°, said phase shifter comprising:

first, second, third and fourth dual gate FET devices;

said phase shifter having a first signal transmission path which goes through said first and third FET devices and a second signal transmission path which goes through said second and fourth FET devices;

means for providing DC bias to the sources, drains and second gates of said FET devices;

said first dual gate FET device having its first gate connected to said input terminal and its second gate capacitively terminated, the value of the bias provided at said second gate being selected to cause the signal transmitted through said first path to experience a reference transmission phase shift and a desired gain $K_1$;

said second dual gate FET device having its first gate connected to said input terminal and its second gate inductively terminated, the value of the bias provided at said second gate being selected to cuase the signal transmitted through said second path to experience a transmission phase shift of substantially $\phi°$ relative to said reference phase shift and a desired gain of $K_2$;

said third and fourth dual gate FET devices having their drains connected in common to said output terminal, said third FET device having its first gate coupled to the drain of said first FET device and its second gate capacitively terminated, said fourth FET device having its first gate coupled to the drain of said second FET device and its second gate capacitively terminated; and means for varying the bias value provided to said second gate of said third FET device and said second gate of said fourth FET device to control the amplitude ratio in which the signal from said third FET device and the signal from said fourth FET device are combined to form the signal at said output terminal.

2. The phase shifter recited in claim 1 including:

a fifth dual gate FET device connected between said first and third FET devices and having its drain coupled to said first gate of said third FET device, its first gate coupled to said drain of said first FET device and its second gate capacitively terminated and provided with a bias voltage selected in accordance with said reference transmission phase shift and said gain $K_1$; and a sixth dual gate FET device connected between said second and fourth FET devices and having its drain coupled to said first gate of said fourth FET device, its first gate connected to said drain of said second FET device and its second gate inductively terminated and provided with a bias voltage selected in accordance with said relaive phase shift and said gain $K_2$.

3. The phase shifter recited in claim 1 wherein $K_1$ is substantially equal to $K_2$.

4. An RF phase shifter for providing a selectable phase shift comprising:

a common input terminal;

a common output terminal;

first and second dual gate FET devices having their drains connected in common to said output terminal and having both their first gates connected in common to said input terminal, the second gate of said first FET device geing capacitively terminated and the second gate of said second FET device being inductively terminated;

means for providing DC bias to the sources, drains and second gates of said dual gate FET devices; and means for switching between a first bias condition in which said second gate of said second FET device is biased OFF and said second gate of said first FET device is biased ON at a voltage at which the relative transmission phase shift for a signal transmitted from said input terminal to said output terminal is substantially 0° and a second bias condition in which said second gate of said first FET device is biased OFF and asid second gate of said second FET device is biased ON at a voltage at which the relative transmission phase shift for a signal transmitted from said input terminal to said output terminal is substantially $\phi°$.

5. The phase shifter recited in claim 4 wherein said bias voltages are selected to provide equal signal gains for 0° phase shift and $\phi°$ phase shift.

6. The phase shifter recited in claim 4 further comprising:

a second phase shifter which is substantially identical to the first recited phase shifter connected in cascade with said first recited phase shifter and connected for switching in common with said first phase shifter whereby phase shifts of 0° and $2\phi°$ may be selected.

7. The phase shifter recited in claim 6 wherein $\phi°$ is substantially 45°.

8. A phase shifter sysem for providing a continuously variable phase shift in the range from 0° to 360°, comprising:

a system input terminal;

a system output terminal;

first, second, third and fourth phase shifter sections each having a section input terminal and a section output terminal, said sections connected in series output to input between said system input terminal and said system output terminal;

said first section:

being a continuously variable phase shifter and having first and second signal paths;

said first path comprising first and second dual gate FET devices each having a source and a drain device having its first gate coupled to said first section input terminal and its second gate capacitively terminated, said second FET device having its first gate coupled to the drain of said first FET device and its second gate capacitively terminated;

said second path comprising third and fourth dual gate FET devices each having a source and a drain, said third FET device having its first gate coupled to said first section input terminal and its second gate inductively terminated, said fourth FET device having its first gate coupled to the drain of said third FET device and its second gate inductively terminated;

a combiner comprising fifth and sixth dual gate FET devices having their drains coupled in common to said first section output terminal, said fifth FET device having its first gate coupled to the drain of said second FET device and its second gate capacitively terminated, said sixth FET device having its first gate coupled to the drain of said fourth FET device and its second gate capacitively terminated;

means for providing DC bias to the sources, drains and second gates of said first, second, third, fourth, fifth and sixth dual gate FET devices;

the value of the bias provided at said second gates of said first and second FET devices being selected to cause the signal transmitted through said first path to have a relative transmission phase of substantially 0°;

the value of the bias provided at said second gates of said third and fourth FET devices being selected to cause the signal transmitted through said second path to experience a transmission phase shift of substantially 90° more than is experienced by said signal transmitted through said first path; and means for varying the value of the bias provided at said second gate of said fifth FET device and said second gate of said sixth FET device to control the amplitude ratio in which said signal transmitted through said first path and said signal transmitted through said second path are combined to form the output signal emerging from said continuously variable phase shifter section at its output terminal;

said second, third and fourth sections each being switchable between a relative phase shift of 0° and a relative phase shift of 90°, each switchable section comprising:

seventh and eigth dual FET gate devices each having a source and a drain and having their first gates coupled in common to said section input terminal, and having their drains coupled in common, said seventh FET device having its second gate capacitively terminated, said eighth FET device having its second gate inductively terminated;

ninth and tenth dual gate FET devices each having a source and a drain and having their first gates coupled in common to the drains of said seventh and eigth FET devices and having their drains coupled in common to said section output terminal, said ninth FET device having its second gate capacitively terminated, said tenth FET device having its second gate inductively terminated;

means for providing DC bias to the sources, drains and second gates of said seventh, eighth, ninth and tenth dual gate FET devices; and means for switching between a first bias condition in which said second gates of said eigth and tenth FET devices are biased OFF and said second gates of said seventh and ninth FET devices are biased ON at a voltage which causes a signal transmitted from said section input terminal to said section output terminal to experience a relative phase shift of substantially 0° and a second bias condition in which said second gates of said seventh and ninth FET devices are biased OFF and said second gates of said eighth and tenth FET devices are biased on at a voltage which causes a signal transmitted from said section input terminal to said section output terminal to experience a phase shift of substantially 90° more than said phase shift experienced when said seventh and ninth FET devices are biased ON.

* * * * *